(12) United States Patent
Hotzel

(10) Patent No.: US 9,005,882 B2
(45) Date of Patent: Apr. 14, 2015

(54) RETICLE DEFECT CORRECTION BY SECOND EXPOSURE

(71) Applicant: GlobalFoundries Inc., Grand Cayman, KY (US)

(72) Inventor: Arthur Hotzel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/275,688

(22) Filed: May 12, 2014

(65) Prior Publication Data

US 2014/0247438 A1    Sep. 4, 2014

Related U.S. Application Data

(62) Division of application No. 13/244,426, filed on Sep. 24, 2011, now Pat. No. 8,785,112.

(51) Int. Cl.
| | |
|---|---|
| G03F 7/20 | (2006.01) |
| G03F 7/40 | (2006.01) |
| G03F 1/24 | (2012.01) |
| G03F 1/72 | (2012.01) |
| G03F 1/84 | (2012.01) |

(52) U.S. Cl.
CPC .. *G03F 7/40* (2013.01); *G03F 1/24* (2013.01); *G03F 1/72* (2013.01); *G03F 1/84* (2013.01); *G03F 7/70466* (2013.01); *G03F 7/70283* (2013.01); *G03F 7/7045* (2013.01); *G03F 7/7065* (2013.01)

(58) Field of Classification Search
USPC ........................................ 430/5, 311, 30, 322
See application file for complete search history.

(56) References Cited

U.S. PATENT DOCUMENTS

| | | | |
|---|---|---|---|
| 5,795,685 A * | 8/1998 | Liebmann et al. | 430/5 |
| 2004/0151993 A1 * | 8/2004 | Hasegawa et al. | 430/5 |
| 2005/0250021 A1 * | 11/2005 | Chen et al. | 430/5 |
| 2008/0169436 A1 * | 7/2008 | Carroll | 250/492.22 |
| 2009/0023101 A1 * | 1/2009 | Smayling | 430/325 |
| 2013/0078746 A1 | 3/2013 | Hotzel | |

* cited by examiner

*Primary Examiner* — Brittany Raymond
(74) *Attorney, Agent, or Firm* — Ditthavong & Steiner, P.C.

(57) ABSTRACT

Correction of reticle defects, such as EUV reticle defects, is accomplished with a second exposure. Embodiments include obtaining a reticle with a first pattern corresponding to a design for a wafer pattern, detecting dark defects and/or design/OPC weak spots in the first pattern, exposing a resist covered wafer using the reticle, and exposing the wafer using a second reticle with a second pattern or a second image field with openings corresponding to the dark defects, with a repair pattern on the reticle or on another reticle, or with a programmed e-beam or laser writer.

20 Claims, 8 Drawing Sheets

FIG. 1A                      FIG. 1B

RETICLE DEFECT CORRECTION BY SECOND EXPOSURE

CROSS REFERENCE TO RELATED APPLICATIONS

This application is a divisional of U.S. application Ser. No. 13/244,426 filed Sep. 24, 2011, the entirety of which is incorporated herein.

TECHNICAL FIELD

The present disclosure relates to corrections of reticle defects or design or OPC weak spots by a second exposure. The present disclosure is particularly applicable to extreme ultraviolet (EUV) reticles, for semiconductor devices in 28 nanometer (nm) and 20 nm technology nodes and beyond.

BACKGROUND

A lithographic photomask, or reticle, is conventionally used for patterning wafers. Reticle defects at critical points in the design may lead to a total chip yield loss. This issue is particularly severe for EUV technology where defect-free reticles are difficult to obtain, as will be explained below. An EUV reticle is formed from an EUV blank, which includes a reflective multilayer dielectric stack (for example, fifty alternating layers) on a non-transmissive (to EUV radiation) substrate. Due to the complex build, it is currently impossible to manufacture EUV blanks that are entirely free of defects. Blank induced EUV reticle defects are often irreparable, but may be avoided by shifting the reticle pattern with respect to the blank to move the blank defects into a non-critical design region. However, this method only works if the design and blank defect map are favorably matched, and if the blank defects are detected prior to manufacturing the reticle. In addition, non-blank induced defects in an EUV reticle cannot be corrected in this manner. Finding blanks that are suitable for a given design takes time and increases cost for the reticles.

Some EUV reticle defects (but only a minority of blank-induced defects) may be repaired. For conventional transmissive reticles, defect repair is often possible, but if the defects are only detected after completion of the manufacturing process, the repair requires in most cases the removal of the pellicle (a thin organic membrane on a metal frame that is glued to the front surface, or active side, of the reticle), which takes time and may damage the reticle. Alternatively, all reticle defects may be corrected by writing a replacement reticle. However, writing a new reticle is expensive and adds significant time to the setup time for a product, as no wafers may be printed while the new reticle is being produced. Further, a new reticle must be qualified again (i.e., checked again for errors), thereby adding more time to the setup time, and may include as many or more defects than the original reticle. For EUV, the new reticle will suffer from the same issue of inherent blank defectivity as the original reticle. The reliable supply of defect-free EUV reticles is at present an unsolved problem for the industry.

Weak spots may also be present in the design or be caused by optical proximity correction (OPC) and may have the same effect as reticle defects. Such detected weak spots require a design re-spin and the writing of a replacement reticle, both of which are costly and time consuming.

A need therefore exists for methodology enabling reticle defect, design weak spot, or OPC weak spot correction to obtain a defect-free pattern on a wafer, without the need for a replacement reticle.

SUMMARY

An aspect of the present disclosure is a method of correcting reticle defects by a second exposure using a repair pattern on the reticle or using a second reticle.

Another aspect of the present disclosure is a method of correcting reticle defects by a second exposure with a programmed electron beam (e-beam) writer or laser writer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: obtaining a first reticle with a first pattern corresponding to a design for a wafer pattern; detecting dark defects and/or design/OPC weak spots in the first pattern; obtaining a second reticle with a second pattern, the second pattern being dark except for openings corresponding to the dark defects and/or design/OPC weak spots in the first pattern, or forming a second pattern of openings on the first reticle in a region outside the first pattern, the openings corresponding to the dark defects and/or design/OPC weak spots in the first pattern; and exposing a resist covered wafer using the first and second patterns. Herein, the wafer pattern defined by the first pattern on the first reticle may belong to one layer in the wafer production process which is preceded and/or succeeded by other patterned layers formed with other reticles.

Aspects of the present disclosure include detecting clear defects in the first pattern; and converting the clear defects to dark defects in the first pattern prior to obtaining the second reticle or forming the second pattern, for example by depositing an absorbing material on the clear defects and adjoining clear regions. Further aspects include adding alignment marks and/or overlay marks and/or metrology structures on the second reticle or in the second pattern on the first reticle; providing matching overlay marks in the first pattern or on another reticle used for patterning a layer on the wafer prior to or subsequent to exposing the resist covered wafer using the first and second patterns and/or leaving dark areas in the first pattern at the positions corresponding to the metrology structures; and aligning the openings of the second pattern with the defects and/or design/OPC weak spots of the first pattern using the alignment marks and/or measuring the structures corresponding to the overlay marks and/or metrology structures which are formed on the wafer after the exposures and development of the resist, thereby monitoring the process of the exposure with the second pattern. Other aspects include repairing some of the detected defects in the first pattern; converting remaining clear defects to dark defects; and obtaining a second reticle, or forming a second pattern on the first reticle, having openings corresponding to remaining dark defects. Additional aspects include selecting a dose of exposure for the second pattern; evaluating the wafer after the exposures and development of the resist or a subsequent etch process; adjusting the dose and alignment of the second exposure; and exposing one or more additional resist covered wafers using the adjusted dose and alignment. Another aspect includes the first reticle being an EUV reticle. Further aspects include developing the resist, etching the wafer or implanting into the wafer, and stripping the resist; and coating a new resist onto the wafer, between exposing the resist coated wafer using the first pattern and exposing the resist coated wafer using the second pattern.

Another aspect of the present disclosure is a method including: obtaining a first reticle with a first pattern corresponding to a design for a wafer pattern; detecting dark defects and/or design/OPC weak spots in the first pattern; forming one or more repair patterns on the first reticle, in the region outside the first pattern, or on a second reticle; selecting the best matching repair pattern for each defect and/or design/OPC weak spot in the first pattern; exposing a resist covered wafer using the first pattern; and exposing portions of the wafer corresponding to the dark defects and/or design/OPC weak spots using the repair patterns. Herein, the wafer pattern defined by the first pattern on the first reticle may belong to one layer in the wafer production process which is preceded and/or succeeded by other patterned layers formed with other reticles.

Aspects include detecting clear defects in the first pattern; and converting the clear defects to dark defects in the first pattern prior to exposing the wafer using the first pattern. Other aspects include converting the clear defects to dark defects by depositing an absorbing material on the clear defects and adjoining clear regions. Further aspects include adding alignment marks and/or overlay marks and/or metrology structures in the region of the repair patterns; providing matching overlay marks in the first pattern or on another reticle used for patterning a layer on the wafer prior to or subsequent to exposing the resist covered wafer using the first pattern and the repair patterns and/or leaving dark areas in the first pattern that correspond to the areas containing the metrology structures; and aligning the openings of the second pattern with the defects and/or design/OPC weak spots of the first pattern using the alignment marks and/or exposing the wafer with the overlay marks and/or metrology structures that were added in the region of the repair patterns while aligning the marks and/or structures with the corresponding marks and dark areas of the first pattern or the another reticle, respectively, in addition to the exposures of the wafer with the first pattern and the selected repair patterns and/or measuring the structures corresponding to the overlay marks and/or metrology structures which are formed on the wafer after the exposures and development of the resist, thereby monitoring the process of the exposures with the repair patterns. Further aspects include detecting dark defects and clear defects in the first pattern; repairing some of the detected defects; converting remaining clear defects to dark defects; and exposing portions of the wafer corresponding to the remaining dark defects using the repair patterns. Another aspect includes selecting doses of exposure for the repair patterns; evaluating the wafer after the exposures and development of the resist or a subsequent etch process; adjusting the doses and alignment of the exposures with the repair patterns; and exposing one or more additional resist covered wafers using the adjusted doses and alignment. Additional aspects include the reticle being an EUV reticle. Further aspects include developing the resist, etching the wafer or implanting into the wafer, and stripping the resist; and coating a new resist onto the wafer, between exposing the resist coated wafer using the first pattern and exposing the resist coated wafer using at least one of the repair patterns.

Another aspect of the present disclosure is a method including: obtaining a reticle; detecting dark defects and/or design/OPC weak spots on the reticle; programming an e-beam or laser writer to expose the wafer in the regions corresponding to the defects and/or design/OPC weak spots on the reticle; and exposing a resist covered wafer with the reticle and with the programmed e-beam or laser writer. Herein, the wafer pattern defined by the reticle may belong to one layer in the wafer production process which is preceded and/or succeeded by other patterned layers formed with other reticles.

Aspects include detecting clear defects on the first reticle; and converting the clear defects to dark defects on the first reticle prior to exposing the wafer using the first reticle. Further aspects include converting the clear defects to dark defects by depositing an absorbing material on the clear defects and adjoining clear regions. Further aspects include programming the e-beam or laser writer to write overlay marks and/or metrology structures in addition to exposing the wafer in the regions corresponding to the defects and/or weak spots on the reticle, prior to exposing the resist covered wafer with the e-beam or laser writer; providing matching overlay marks on the reticle or on another reticle used for patterning a layer on the wafer prior to or subsequent to exposing the resist covered wafer using the reticle and the e-beam or laser writer and/or leaving dark areas on the reticle corresponding to the programmed metrology structures; and measuring structures corresponding to the overlay marks and/or metrology structures which are formed on the wafer after the exposures and development of the resist, thereby monitoring the process of the exposure with the e-beam or laser writer.

Other aspects include detecting dark defects and clear defects; repairing some of the detected defects; converting remaining clear defects to dark defects; and exposing portions of the wafer corresponding to the remaining dark defects with the e-beam or laser writer. Another aspect includes the reticle being an EUV reticle. Additional aspects include developing the resist, etching the wafer or implanting into the wafer, and stripping the resist; and coating a new resist onto the wafer, between exposing the resist coated wafer using the first reticle and exposing the resist coated wafer using the e-beam or laser beam.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1A through 1C schematically illustrate a reticle with defects, a correction reticle, and a defect-free resist pattern, respectively, in accordance with an exemplary embodiment;

DETAILED DESCRIPTION

Figure 1C:
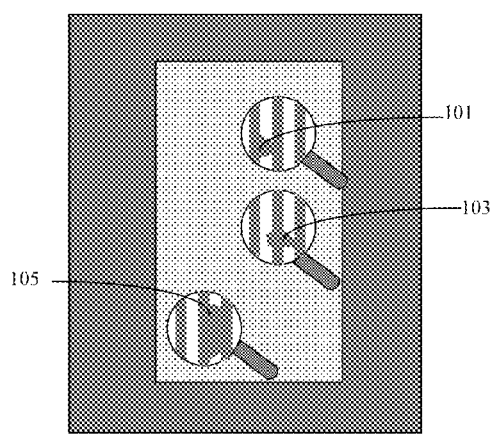

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reticle defects and design and OPC weak spots attendant upon lithographic patterning of a wafer. In accordance with embodiments of the present disclosure, the wafer is exposed a second time using a correction reticle, a repair kit on the original reticle, or a programmed e-beam writer. The correction reticle may have a short write and inspection time and may be significantly less expensive than the original reticle. Likewise, a predefined repair kit written together with the original design to the same reticle does not add significant write and inspection time, and is less expensive than writing a new reticle.

Methodology in accordance with embodiments of the present disclosure includes obtaining a first reticle with a first pattern corresponding to a design for a wafer pattern, detecting dark defects and/or design/OPC weak spots in the first pattern, obtaining a second reticle with a second pattern, the second reticle being dark except for openings corresponding to the dark defects and/or design/OPC weak spots in the first pattern, or forming a second pattern of openings on the first reticle in a region outside the first pattern, the openings corresponding to the dark defects and/or design/OPC weak spots in the first pattern, and exposing a resist covered wafer using the first and second patterns.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Areas on the reticle, and defects in particular, may be described as clear areas (defects), those that transmit light or reflect EUV radiation, or dark areas (defects), which block light or EUV radiation. Clear defects on a reticle may be turned into dark defects in a repair process. Design or OPC weak spots, however, are generally too numerous to repair or modify on the reticle; therefore, only dark design or OPC weak spots (i.e. those that lead to a lack of illumination on the wafer) may be corrected in accordance with the present disclosure, unless the number of instances of clear weak spots on the reticle is less than approximately 100. Within this limitation, although correction of reticle defects will be described below, correction of design and OPC weak spots may be accomplished in a similar fashion. It is understood that usually only those defects or weak spots that may lead to unacceptable deviations of the wafer pattern from the target pattern (i.e., those which are said to be "out of spec") are addressed. Finally, all descriptions apply to reflective reticles (like EUV reticles) as well conventional transmissive reticles. The term "opening" is used equally for a clear area on a transmissive or a reflective reticle.

FIGS. 1A through 1C illustrate a reticle with defects, a correction reticle, and a defect-free resist pattern, respectively, in accordance with an exemplary embodiment. Adverting to FIG. 1A, a patterned reticle is illustrated as having three dark defects, 101, 103, and 105. If a wafer is exposed using the reticle of FIG. 1A, the portions that correspond to defects 101, 103, and 105 will not be exposed, and after development of the exposed resist layer, defects will be formed at the corresponding positions in the resist pattern.

Illustrated in FIG. 1B is a correction reticle, in accordance with an exemplary embodiment, which is primarily dark, with a clear pattern corresponding to the defects on the original reticle. Specifically, opening 107 corresponds to defect 101, openings 109 and 111 correspond to portions of defect 103, and opening 113 corresponds to defect 105. Note that the size and shape of the openings can differ from the size and shape of the respective dark defects to obtain the optimum result, or to facilitate manufacturing. Assist patterns, e.g. overlay marks, may be included in the original reticle and the correction reticle, similar to assist patterns employed for double patterning, to aid in aligning the correction reticle with the original reticle; other metrology structures may be included in the correction reticle to measure the critical dimension or size of the corresponding structures formed on the wafer after exposure and resist development. By exposing the wafer twice, once using the original reticle and a second time using the correction reticle, the combined exposures lead to a defect-free resist pattern, as illustrated in FIG. 1C. Although this embodiment requires the manufacturing of an additional correction reticle with similar precision requirements as those of the original reticle, it nevertheless offers clear benefits compared to a complete reticle re-write, since the correction reticle will contain an extremely small amount of patterned area. The write and inspection time required to make the correction reticle will therefore be very small. The same is true for the statistical risk of incurring defects in the few square micrometers of pattern on the correction reticle and, therefore, for the ensuing repair effort and risk of reticle yield loss. Most importantly for EUV, due to the low amount of patterned area on the correction reticle, blank defectivity will be a very minor issue here, allowing the use of lower-grade blanks. Therefore, the correction reticle will be cheaper than the original reticle and require shorter manufacturing time. Alternatively, if the original image field is small enough to leave sufficient room on the reticle (e.g., if it is placed in the upper half of the reticle only), the correction pattern might be formed on the same reticle (e.g., in the lower half) in a second reticle patterning step.

Figure 2:
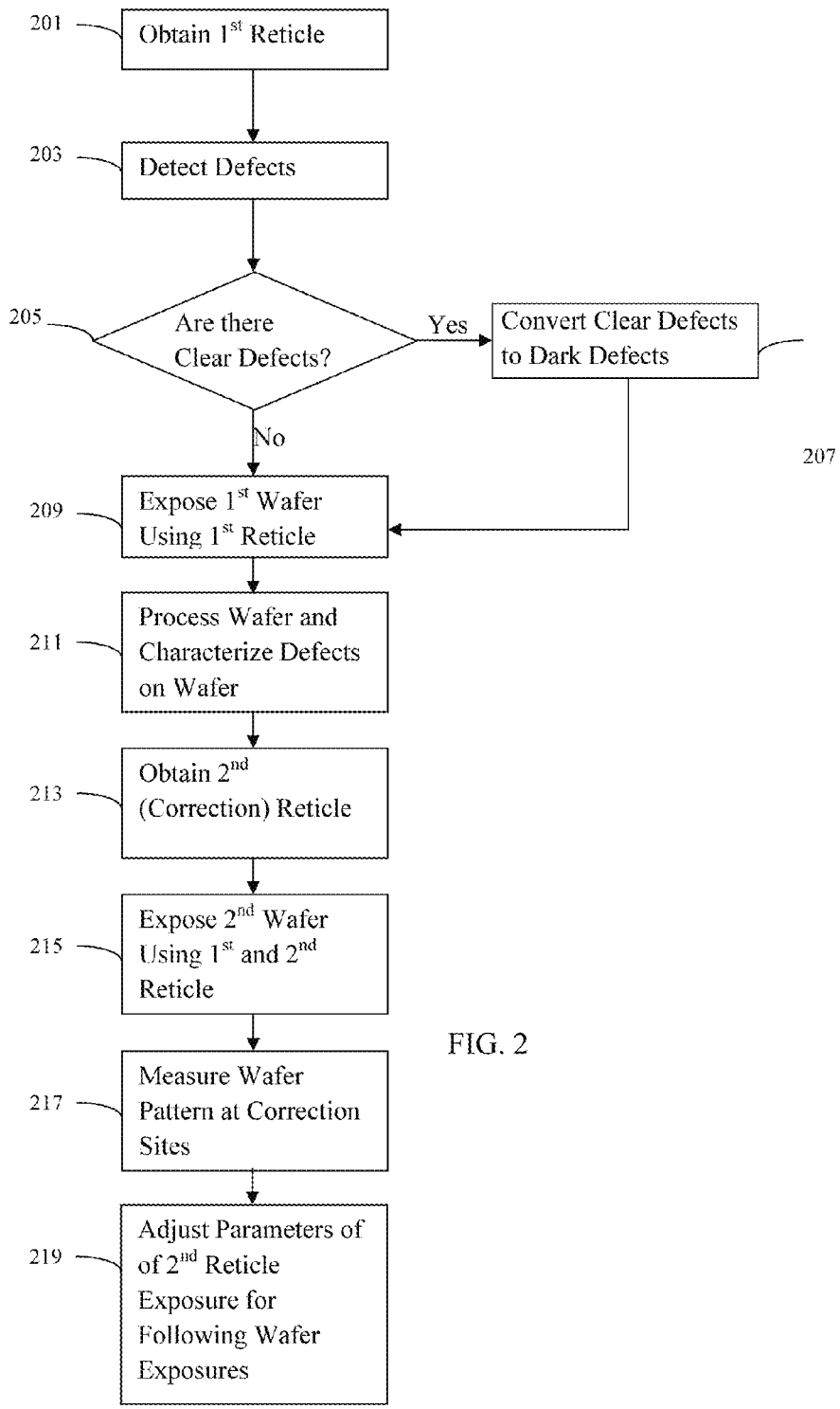
FIG. 2 shows a process flow for the exemplary embodiment associated with FIG. 1.

Adverting to FIG. 2, a process flow for the first exemplary embodiment is shown. As illustrated, a first reticle, such as that shown in FIG. 1A, is obtained in step 201, which can include the repair of some reparable defects; remaining out-of spec defects are detected on the reticle in step 203. The defects may be classified as dark defects and clear defects. A determination is made at step 205 as to whether the reticle includes any clear defects. Such clear defects are converted to dark defects (step 207), as described in more detail with respect to FIGS. 7A and 7B below. The remaining defects and any newly created dark defects may then be characterized. A resist covered wafer may then be exposed using the first reticle (step 209) and the defects may be characterized on the wafer (step 211). Optimum additional exposure conditions, such as aerial image, shape of repair pattern, dose, alignment, and focus may be determined, and a second, or correction, reticle, such as that shown in FIG. 1B, may be obtained (step 213). Another resist covered wafer is then exposed using the first reticle and additionally exposed a second time using the correction reticle (step 215). The exposure with the correction reticle can occur after or before the exposure with the first reticle. In further optimization, the resulting wafer pattern at the defect positions may be characterized (step 217), and the alignment and dose for the second exposure may be adjusted to achieve the best result in further wafer exposures (step 219). Overlay marks and metrology structures may be included in the correction reticle in step 213, and matching overlay marks and dark areas provided in the first reticle in step 201; the measurement of the corresponding structures formed on the wafer after exposure and resist development may be used to monitor and control the exposure with the correction reticle in the further wafer exposures following step 219. In accordance with this embodiment, a single design containing tailor-made repair patterns for all defects, at positions corresponding to the original design, is employed. The repair pattern may be optimized for actual defects and easily aligned with the defects, and only one additional exposure is required. Although the correction exposure may be done in the same chamber and with the same tool as the original exposure (e.g., an EUV tool), the correction exposure may take place in a less advanced tool, for example, a conventional exposure tool, and may employ conventional UV light, rather than using EUV in an EUV tool; in this case, the correction reticle would be a conventional reticle, too. Use of the less advanced tool has the advantage of reducing costs, whereas an EUV tool has superior resolution. Further, the second exposure may alternatively be performed prior to the first exposure.

Figure 1C:
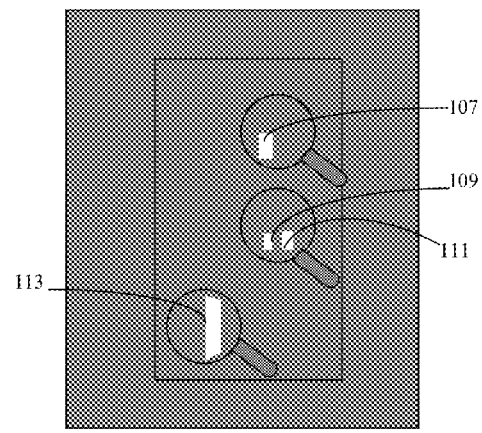
Figure 1C:
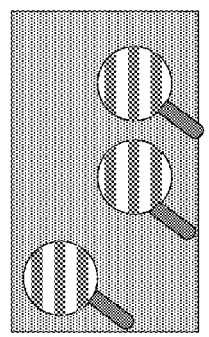
Figure 3:
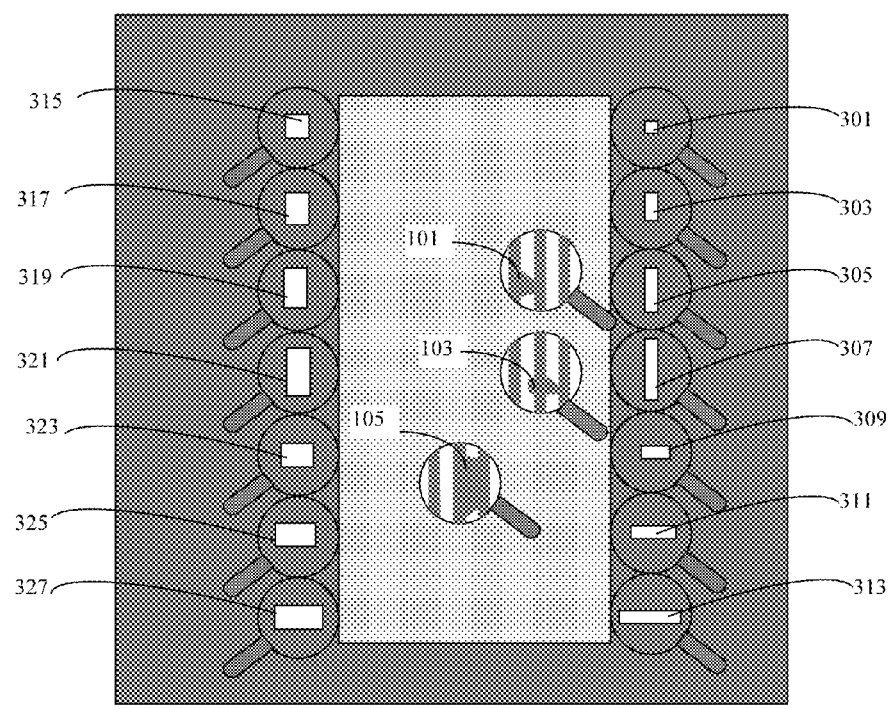
FIG. 3 schematically illustrates a reticle including a predefined repair kit in the margins, in accordance with another exemplary embodiment.
Figure 4:
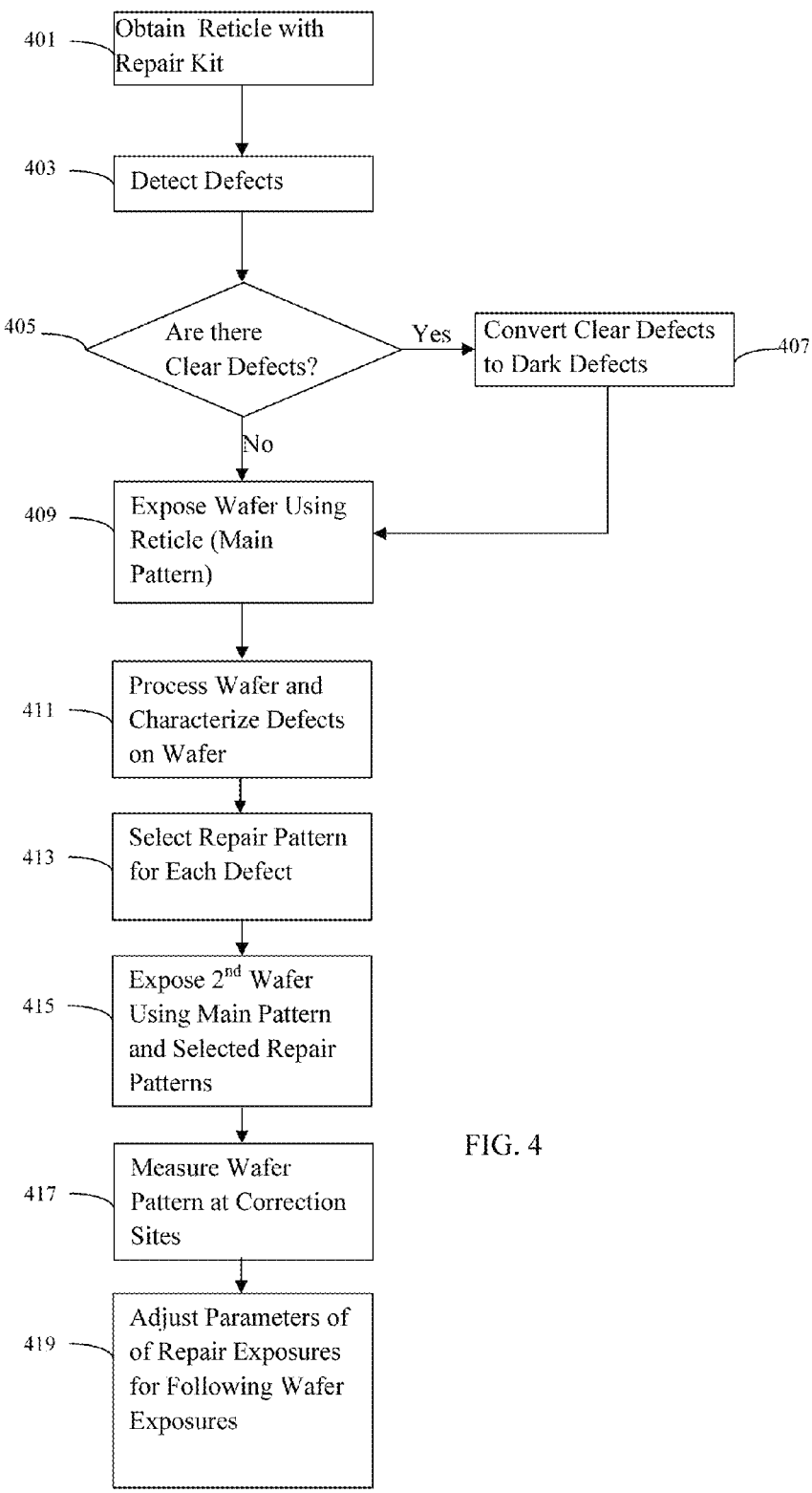
FIG. 4 shows a process flow for the exemplary embodiment associated with FIG. 3.

In accordance with another embodiment, instead of obtaining a separate correction reticle, a pre-defined repair kit may be included in the margins of the original reticle, as illustrated in FIG. 3. As shown, the reticle includes the same defects 101, 103, and 105 as in FIG. 1A, but also includes exemplary repair patterns 301 through 327. The repair patterns may be small standard clear polygons well separated from each other and from the main image fields. For each dark defect in the original design, the most appropriate repair pattern is selected, and an additional exposure is applied to the resist on the wafer. For example, for defect 101, repair pattern 303 is the closest match, whereas for defect 103, repair patterns 301 (for the left-most portion of the defect) and 303 (for the right-most portion of the defect) are optimal, and for defect 105, repair pattern 307 is the best match. Doses of additional exposures are optimized for the best repair results, and scanner reticle masking (REMA) blades are employed for narrowing the fields of additional exposures to selected repair patterns. Although not shown for illustrative convenience, the repair pattern on the original reticle may alternatively be tailor-made to correspond to the actual defects, and therefore be optimized for the actual defects. However, a second patterning step of the reticle would be required. In still another variant, a larger and more variable repair kit may be put on a separate reticle, potentially serving as a universal repair reticle for several production reticles. As in the exemplary embodiments described with reference to FIGS. 1 and 2, assist structures, as alignment marks, overlay marks, and metrology structures, may be added to the repair kit (especially if the kit is placed on a separate reticle), and corresponding structures may be added to the original design.

the second exemplary embodiment is illustrated in FIG. 4. As shown, a reticle including both the original design to be printed and a predefined repair kit, as illustrated in FIG. 3, is obtained in step 401. According to step 403, defects are detected and characterized as dark defects or clear defects. If clear defects are detected at step 405, they are converted to dark defects (step 407). A resist covered wafer may then be exposed using the main pattern of the reticle at step 409, and the defects may be characterized on the wafer (step 411). Optimum additional exposure conditions, such as aerial image, shape of repair pattern, dose, alignment, and focus may be determined. For each defect, the most suitable repair pattern and exposure condition is then selected (step 413). Another resist covered wafer is then exposed using the main pattern and each of the selected repair patterns on the reticle (step 415). The exposure with the repair patterns can occur after the exposure with the main pattern, or the exposure with some or all of the repair patterns can occur before the exposure with the main pattern. Scanner reticle masking blades may be employed for narrowing the field of additional exposure to the selected repair pattern, and the reticle is re-aligned before each additional exposure. Upon reviewing the resulting wafer pattern at the repair sites (step 417), the parameters of the additional exposures may be readjusted for further wafer exposures (step 419). Overlay marks and metrology structures added to the original designs and the repair kit in step 401 and exposed together with and in addition to the original design and the selected repair patterns, respectively, may be used to monitor and control the exposure of the repair patterns in the exposure of further wafers following step 419. Since the repair kit is not specifically tailored to the design, correction of the defects will usually involve multiple exposures using the repair kit, each time aligning a repair pattern with a defect, while masking other patterns. This will likely limit the practicability of this method to cases where the number of defects in the original pattern is relatively small, i.e. smaller than approximately 10. Since design or OPC spots are usually more numerous than this when they occur, the applicability of this method will in most cases be limited to real defects. However, a pre-defined repair kit has the advantage of saving product setup time as no time is lost for writing a repair pattern after completion of the original pattern. Besides, if the repair kit is placed on the original reticle together with the design, it is not necessary to exchange reticles between the main and the additional exposures, which saves cycle time and might be beneficial for overlay stability. This embodiment is particularly well suited for contact and via reticles which include mostly clear squares, with a defect generally corresponding to a missing square.

Figure 5:
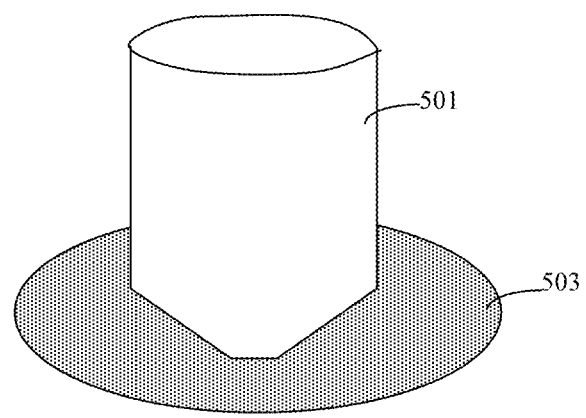
FIG. 5 schematically illustrates a programmable e-beam writer, in accordance with another exemplary embodiment.
Figure 6:
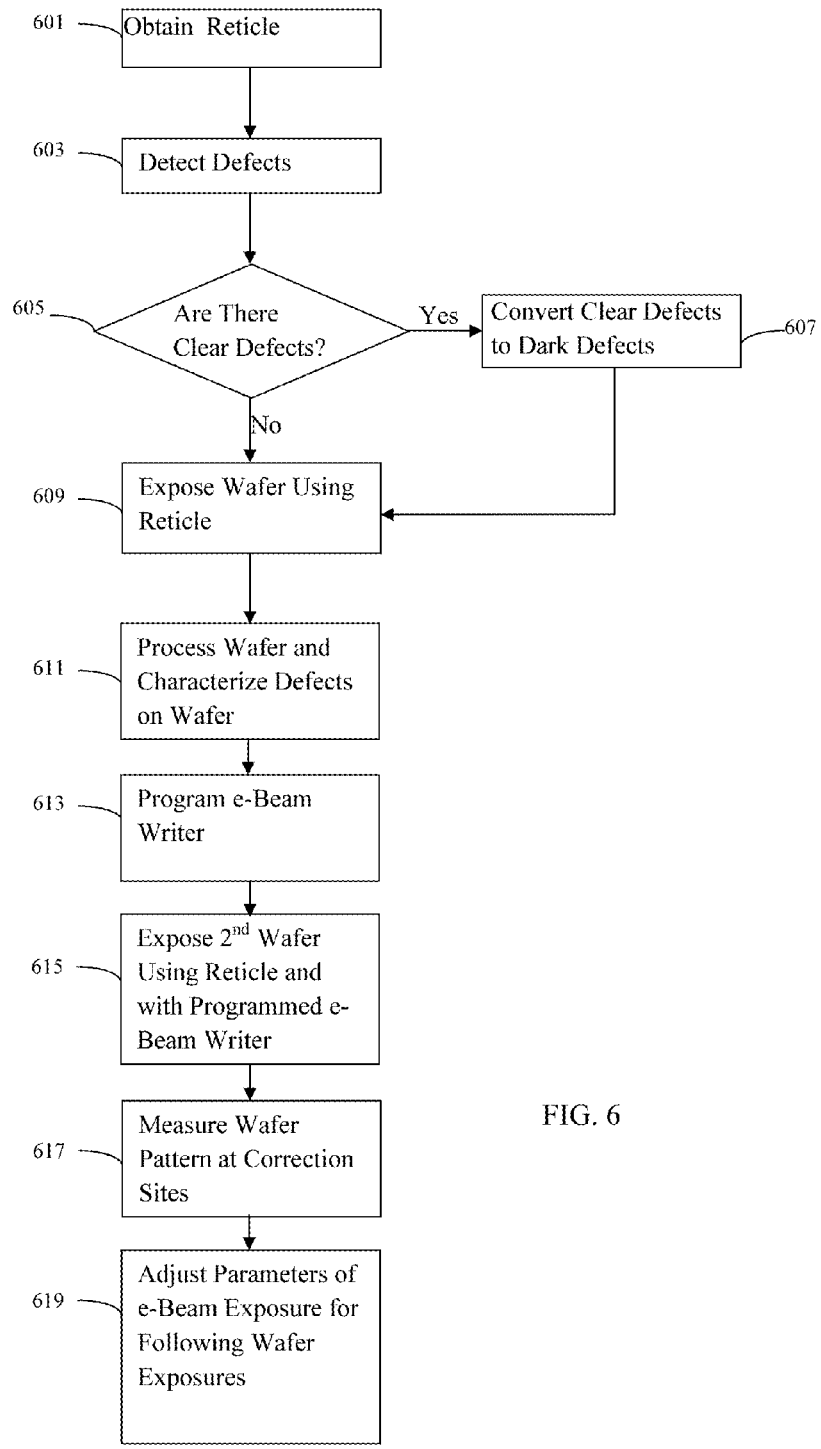
FIG. 6 shows a process flow for the exemplary embodiment associated with FIG. 5.

Adverting to FIG. 5, a programmable e-beam writer 501 is illustrated for directly writing a repair pattern on the resist covered wafer 503 at the defect positions to correct for reticle defectivity, in accordance with another embodiment. A process flow corresponding to the use of an e-beam writer is illustrated in FIG. 6. Adverting to FIG. 6, the process begins similar to the process flows of FIGS. 2 and 4, with a reticle being obtained at step 601, defects being detected at step 603, the presence of clear defects being determined at step 605, clear defects being converted to dark defects at step 607, a wafer being exposed using the reticle at step 609, and defects being characterized on the wafer at step 611. Once only dark defects remain, an e-beam writer is programmed to expose each image field of the wafer at the position of the defects with a suitable correction shape and dose (step 613) and another resist covered wafer is exposed using the reticle and additionally exposed by writing with the e-beam writer (step 615), which can happen after or before the exposure with the reticle. Within step 613, the e-beam writer may be programmed to write additional structures like overlay marks and metrology structures, and corresponding marks and dark areas may be provided in the reticle obtained in step 601. Finally, the resulting defect pattern at the repair sites may be reviewed (step 617) to optimize the parameters of the e-beam write process for further wafer exposures (step 619). The overlay marks and metrology structures may be used to monitor and control the e-beam exposures in the further wafer exposures following step 619. An exemplary estimation shows that the additional cycle time required for the write process will be small: with 100 defects on the reticle, each corresponding to an area of $10\mu^2$ on the wafer, and 100 exposure fields per wafer, the e-beam write area per wafer is 0.1 mm$^2$, and an estimated write time per wafer is less than one minute. Therefore, using an e-beam writer to correct for reticle defects has low time loss and high flexibility with no requirement for additional reticles. However, it does require a separate tool or chamber, whereas exposure using a correction reticle or a repair kit on a reticle may occur in the same tool and chamber as exposure using the original reticle. Using an e-beam writer also requires that the resist used for the exposure be sensitive to both the actinic radiation of the original exposure and to electrons. Alternatively, a laser beam writer with suitable wave length may be employed instead of an e-beam writer; this would, however, result in a poorer resolution of the correction.

Figure 7A:
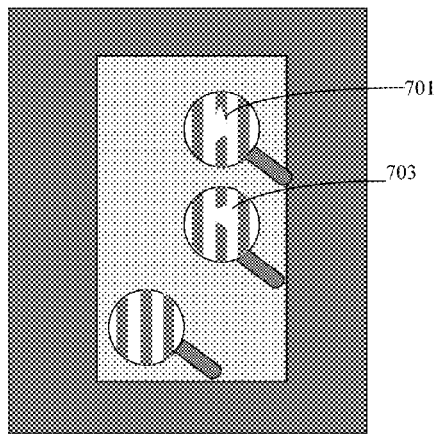
FIGS. 7A and 7B schematically illustrate a reticle with clear defects and the reticle with the clear defects converted to dark defects, in accordance with exemplary embodiments.
Figure 7B:
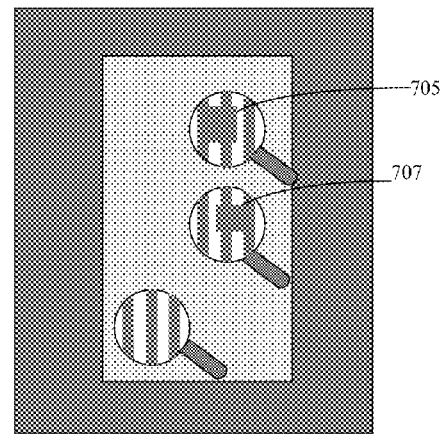

FIG. 7A schematically illustrates a reticle including exemplary clear defects 701 and 703. Adverting to FIG. 7B, the clear defects have been converted to dark defects 705 and 707. The defects are corrected by depositing an absorbing material on the clear defects. However, since the defects are so close to the pattern, some of the reticle surrounding the clear defects is also covered with the absorbing material. Accordingly, correction of the clear defects may cause new dark defects, such as defects 705 and 707.

In the exemplary embodiments described above, it is implied that the reticle defect correction is done by one or more additional exposures of the same resist layer that is exposed using the original reticle pattern. However, the correction may also be done by one or more additional patterning sequences after (or before) the original patterning sequence, in which a patterning sequence includes the steps of resist coating, exposure, resist developing, and etching (or, alternatively, implantation).

Figure 8:
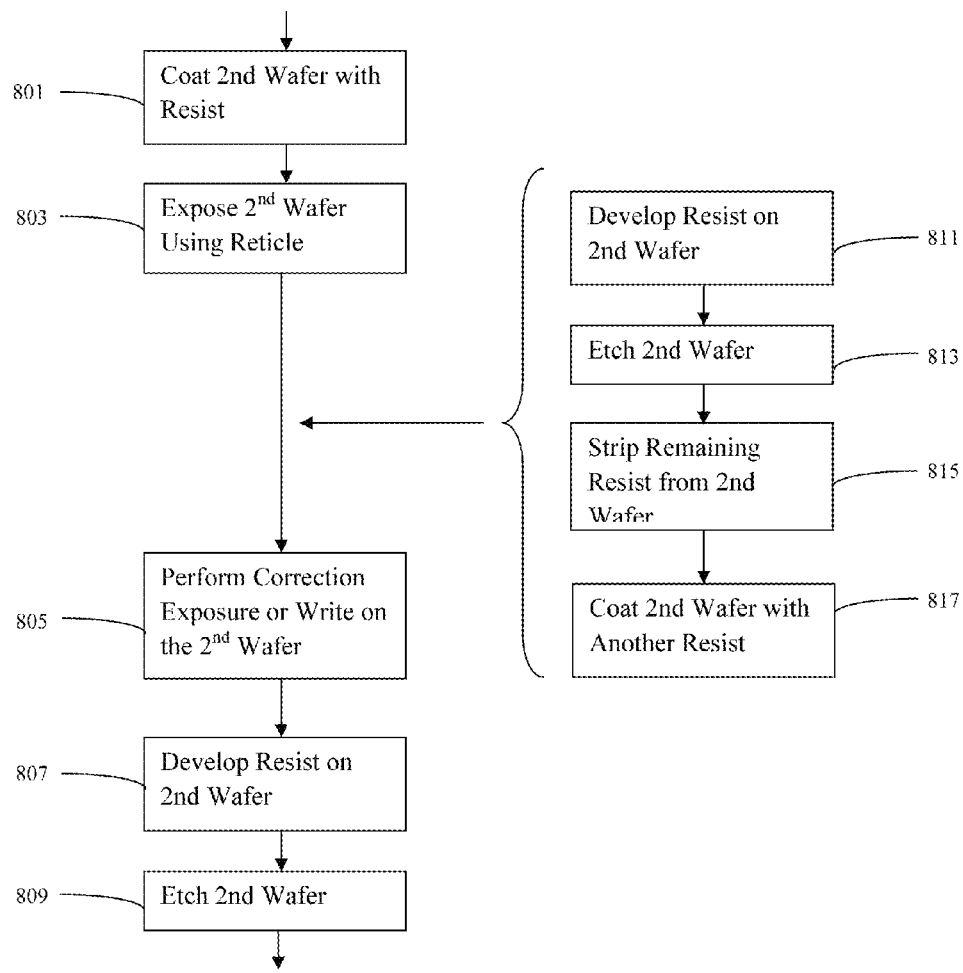
FIG. 8 illustrates an exemplary modification of the process flow for multiple patterning sequences.

FIG. 8 illustrates an exemplary modification of the process flow for multiple patterning sequences (showing only the most important process steps). The sequence on the left hand side of FIG. 8 (steps 801 through 809) illustrates reticle defect correction by additional exposure only, in this case with one additional exposure process after the original exposure. As shown, the wafer is coated with a resist (step 801) before an original exposure (step 803). A correction step 805 is inserted between the original exposure (step 803) and the resist develop process 807. After resist develop, the wafer is etched (step 809). Step 805 is the only additional step compared to the situation with a defect-free reticle. If, however, the correction is done by an additional complete patterning sequence, and not only by an additional exposure step, process steps 811 through 817 will be required between exposure step 803 and correction exposure step 805. Specifically, after the original exposure, resist develop process 811, an etching step 813, stripping of the remaining resist (step 815), and coating of a second resist layer for the second patterning step (step 817) must be additionally inserted into the sequence between steps 803 and 805 as indicated by the horizontal arrow in FIG. 8. In the case of several correction exposures, as in the embodiment depicted in FIG. 3, it is again possible to do all correction exposures within one additional patterning sequence (which will be the most practical variant in most cases), or to split them up into several additional patterning sequences. In general, reticle defect correction by separate patterning sequences requires more additional process steps than correction by additional exposures only, but might offer superior control in certain situations. Conceptually, this variant could also be characterized as an automated wafer repair process. However, apart from the greater number of additional process steps, it is included into the wafer production flow in much the same way as the unaccompanied additional exposures described further up.

All exemplary embodiments shown in FIGS. 1 through 6 can be converted into correction by separate patterning sequences in much the same way.

The embodiments of the present disclosure can achieve several technical effects, such as reticle defect correction at relatively low cost, by using a cheaper second reticle or repair pattern or by using a programmable e-beam or laser beam for a second exposure, without adding significant time to the setup time. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices, particularly for EUV technologies below 20 nm and other 28 nm and 20 nm technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   obtaining a reticle;
   detecting dark defects and/or design/OPC weak spots on the reticle;
   programming an e-beam or laser writer to expose a wafer in regions corresponding to the dark defects and/or design/OPC weak spots on the reticle; and
   exposing the wafer, covered with a resist, with the reticle and with the programmed e-beam or laser writer.

2. The method according to claim 1, comprising exposing the resist covered wafer with the reticle prior to exposing the resist covered wafer with the programmed e-beam or laser writer.

3. The method according to claim 1, comprising exposing the resist covered wafer with the reticle subsequent to exposing the resist covered wafer with the programmed e- beam or laser writer.

4. The method according to claim 1, further comprising:
    detecting clear defects in addition to dark defects on the reticle;
    repairing some of the detected defects; and
    converting remaining clear defects to dark defects prior to exposing the wafer using the reticle; and
    programming the e-beam or laser writer to expose the wafer in regions corresponding the dark defects and the dark defects converted from clear defects.

5. The method according to claim 4, comprising converting the clear defects to dark defects by depositing an absorbing material on the clear defects and adjoining clear regions.

6. The method according to claim 4, comprising:
    exposing a preliminary wafer using the reticle after converting the clear defects to dark defects;
    characterizing defects on the exposed preliminary wafer;
    programming the e-beam or laser writer to expose the resist covered wafer based on the characterized defects.

7. The method according to claim 6, comprising programming the e-beam or laser writer with a suitable correction shape and dose based on the characterized defects.

8. The method according to claim 1, comprising:
    programming the e-beam or laser writer to write overlay marks in addition to exposing the wafer in the regions corresponding to the defects and/or weak spots on the reticle, prior to exposing the resist covered wafer with the e-beam or laser writer;
    providing matching overlay marks on the reticle or on another reticle used for patterning a layer on the wafer prior to or subsequent to exposing the resist covered wafer using the reticle and the e-beam or laser writer; and
    measuring structures corresponding to the overlay marks which are formed on the wafer after exposing the wafer covered with the resist and developing the resist, thereby monitoring the process of the exposure with the e-beam or laser writer.

9. The method according to claim 1, comprising:
    programming the e-beam or laser writer to write metrology structures in addition to exposing the wafer in the regions corresponding to the defects and/or weak spots on the reticle, prior to exposing the resist covered wafer with the e-beam or laser writer;
    providing dark areas on the reticle corresponding to the programmed metrology structures; and
    measuring structures corresponding to the metrology structures which are formed on the wafer after exposing the wafer covered with the resist and developing the resist, thereby monitoring the process of the exposure with the e-beam or laser writer.

10. The method according to claim 1, wherein the reticle is an EUV reticle.

11. The method according to claim 1, further comprising:
    developing the resist, etching the wafer or implanting into the wafer, and stripping the resist; and
    coating a new resist onto the wafer, after exposing the resist covered wafer using the reticle and prior to exposing the resist coated wafer using the e-beam or laser beam.

12. A method comprising:
    obtaining a reticle;
    detecting clear defects and dark defects and/or design/OPC weak spots on the reticle;
    repairing some of the detected defects;
    converting remaining clear defects to additional dark defects;
    characterizing remaining dark defects and additional dark defects;
    determining a suitable correction shape and dose based on the characterized defects;
    programming an e-beam or laser writer to expose a wafer in regions corresponding to the additional dark defects and the remaining dark defects with the suitable correction shape and dose and/or to expose the wafer in regions corresponding to the design/OPC weak spots on the reticle; and
    exposing the wafer, covered with a resist, with the reticle and with the programmed e-beam or laser writer.

13. The method according to claim 12, comprising exposing the resist covered wafer with the reticle prior to exposing the resist covered wafer with the programmed e-beam or laser writer.

14. The method according to claim 12, comprising exposing the resist covered wafer with the reticle subsequent to exposing the resist covered wafer with the programmed e-beam or laser writer.

15. The method according to claim 12, comprising converting the clear defects to dark defects by depositing an absorbing material on the clear defects and adjoining clear regions.

16. The method according to claim 12, comprising:
    programming the e-beam or laser writer to write overlay marks in addition to exposing the wafer in the regions corresponding to the defects and/or weak spots on the reticle, prior to exposing the resist covered wafer with the e-beam or laser writer;
    providing matching overlay marks on the reticle or on another reticle used for patterning a layer on the wafer prior to or subsequent to exposing the resist covered wafer using the reticle and the e-beam or laser writer; and
    measuring structures corresponding to the overlay marks which are formed on the wafer after exposing the wafer covered with the resist and developing the resist, thereby monitoring the process of the exposure with the e-beam or laser writer.

17. The method according to claim 12, comprising:
    programming the e-beam or laser writer to write metrology structures in addition to exposing the wafer in the regions corresponding to the defects and/or weak spots on the reticle, prior to exposing the resist covered wafer with the e-beam or laser writer;
    providing dark areas on the reticle corresponding to the programmed metrology structures; and
    measuring structures corresponding to the metrology structures which are formed on the wafer after exposing the wafer covered with the resist and developing the resist, thereby monitoring the process of the exposure with the e-beam or laser writer.

18. The method according to claim 12, wherein the reticle is an EUV reticle.

19. The method according to claim 12, further comprising:
    developing the resist, etching the wafer or implanting into the wafer, and stripping the resist; and
    coating a new resist onto the wafer, after exposing the resist covered wafer using the reticle and prior to exposing the resist coated wafer using the e-beam or laser beam.

20. A method comprising:
    obtaining a reticle;
    detecting clear defects and dark defects and/or design/OPC weak spots on the reticle;
    repairing some of the detected defects;
    converting remaining clear defects to additional dark defects;

characterizing remaining dark defects and additional dark defects;

determining a suitable correction shape and dose based on the characterized defects;

programming an e-beam or laser writer to write overlay marks and/or metrology structures and to expose a wafer in regions corresponding to the additional dark defects and the remaining dark defects with the suitable correction shape and dose and/or to expose the wafer in regions corresponding to the design/OPC weak spots on the reticle;

providing matching overlay marks and/or dark areas corresponding to the written overlay marks and/or programmed metrology structures on the reticle or on another reticle used for patterning a layer on the wafer prior to or subsequent to exposing the resist covered wafer using the reticle and the e-beam or laser writer;

exposing the wafer, covered with a resist, with the reticle and with the programmed e-beam or laser writer; and measuring structures corresponding to the overlay marks and/or metrology structures which are formed on the wafer after exposing the wafer covered with the resist and developing the resist, thereby monitoring the process of the exposure with the e-beam or laser writer.

* * * * *